United States Patent
Chaudhari

(10) Patent No.: US 9,997,661 B2
(45) Date of Patent: *Jun. 12, 2018

(54) METHOD OF MAKING A COPPER OXIDE/SILICON THIN-FILM TANDEM SOLAR CELL USING COPPER-INORGANIC FILM FROM A EUTECTIC ALLOY

(71) Applicant: Ashok Chaudhari, Briarcliff Manor, NY (US)

(72) Inventor: Ashok Chaudhari, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 10 days.

This patent is subject to a terminal disclaimer.

(21) Appl. No.: 15/264,167

(22) Filed: Sep. 13, 2016

(65) Prior Publication Data

US 2016/0380144 A1    Dec. 29, 2016

Related U.S. Application Data

(60) Provisional application No. 62/367,178, filed on Jul. 27, 2016.

(51) Int. Cl.

| | |
|---|---|
| *H01L 31/18* | (2006.01) |
| *H01L 31/0687* | (2012.01) |
| *H01L 31/0236* | (2006.01) |
| *H01L 31/028* | (2006.01) |
| *H01L 31/0336* | (2006.01) |
| *H01L 31/06* | (2012.01) |

(52) U.S. Cl.
CPC .......... *H01L 31/18* (2013.01); *H01L 31/028* (2013.01); *H01L 31/02363* (2013.01); *H01L 31/0336* (2013.01); *H01L 31/06* (2013.01); *H01L 31/0687* (2013.01); *Y02E 10/50* (2013.01)

(58) Field of Classification Search
CPC .............. H01L 31/18; H01L 31/02363; H01L 31/0687; H01L 31/032; H01L 31/028
See application file for complete search history.

(56) References Cited

U.S. PATENT DOCUMENTS

| | | | |
|---|---|---|---|
| 7,718,574 B2 | 5/2010 | Xiong et al. | |
| 7,914,619 B2 | 3/2011 | de Souza et al. | |
| 8,129,215 B1 | 3/2012 | Campbell et al. | |
| 8,178,221 B2 | 5/2012 | Goyal | |
| 8,491,718 B2 | 7/2013 | Chaudhari | |
| 8,916,455 B2 | 12/2014 | Chaudhari et al. | |

(Continued)

OTHER PUBLICATIONS

Definition of texture. (n.d.) American Heritage® Dictionary of the English Language, Fifth Edition. (2011). Retrieved Nov. 16, 2017 from https://www.thefreedictionary.com/texture.*

(Continued)

*Primary Examiner* — Michael Jung
(74) *Attorney, Agent, or Firm* — Danielle C. Sullivan; Carter Ledyard & Milburn LLP

(57) ABSTRACT

A method of making a copper oxide/inorganic thin film tandem semiconductor device including the steps of: depositing a textured buffer layer on an amorphous substrate, depositing a copper-inorganic film from a solid phase eutectic alloy on said buffer layer, and introducing O₂ to the copper on said inorganic film, forming a copper oxide thin film on said inorganic film.

21 Claims, 4 Drawing Sheets

(56) References Cited

U.S. PATENT DOCUMENTS

| | | | |
|---|---|---|---|
| 9,054,249 B2 | 6/2015 | Chaudhari | |
| 9,349,995 B2 | 5/2016 | Chaudhari | |
| 9,653,696 B2 | 5/2017 | Chaudhari | |
| 9,719,165 B2 | 8/2017 | Vispute et al. | |
| 9,722,130 B2 | 8/2017 | Chaudhari | |
| 9,818,964 B2 | 11/2017 | Chaudhari | |
| 9,859,450 B2 | 1/2018 | Chaudhari | |
| 2012/0288673 A1 | 11/2012 | Clemens et al. | |
| 2014/0182671 A1* | 7/2014 | Krasnov | H01L 31/022425 136/256 |
| 2014/0245947 A1 | 9/2014 | Vispute et al. | |
| 2015/0197844 A1 | 7/2015 | Clemens et al. | |
| 2015/0267289 A1 | 9/2015 | Vispute et al. | |
| 2015/0357500 A1* | 12/2015 | Komatsu | C25B 1/003 136/255 |
| 2017/0324053 A1* | 11/2017 | Tabet | H01L 51/4226 |

OTHER PUBLICATIONS

Caskey, C.M. et al., "Thin film synthesis and properties of copper nitride, a metastable semiconductor," (2014). Mater. Horiz. 2014, 1, 424.*

Yin, Wei, et al. "Recent Advances in Interface Engineering for Planar Heterojunction Perovskite Solar Cells", Molecules, Jun. 2016, pp. 1-18, vol. 21, 837, MDPI, Switzerland.

Wong, Terence et al. "Current Status and Future Prospects of Copper Oxide Heterojunction Solar Cells", Materials, Apr. 2016, pp. 1-21, vol. 9, 271, MDPI, Switzerland.

Tolstova, Yulia et al. "Heteropitaxial Growth of Pt and Au Thin Films on MgO Single Crystals by Bias-Assisted Sputtering", Scientific Reports, Mar. 2016, pp. 1-6, vol. 6, 23232, USA.

Wee, Sung Hun, et al. "Heteroepitaxial Cu2O Thin Film Solar Cell on Metallic Substrates", Scientific Reports, Nov. 2015, pp. 1-7, vol. 5: 16272, USA.

Zhao, Guoqing, et al."Stable Ultrathin Partially Oxidized Copper Film Electrode for Highly Efficient Flexible Solar Cells", Nature Communications, Nov. 2015, pp. 1-8, vol. 6:8830, Macmillan,USA.

Valladares, L. et al. "Crystallization and Electrical Resistivity of Cu2O and CuO obtained by Thermal Oxidation of Cu Thin Films on SiO2/Si Substrates", Thin Solid Films, Jun. 2012, pp. 6368-6374, vol. 520, Elsevier USA.

Darvish, Davis et al. "Modeling, Synthesis and Characterization of Thin Film Copper Oxide for Solar Cells", IEEE, 2009, pp. 02195-02199, USA.

Shtein, Max, "Thin Metal Films as Simple Transparent Conductors", SPIE Newsroom, Dec. 28, 2009, pp. 1-2, USA.

Speakman, Scott. "Introduction to High Resolution X-Ray Diffraction of Epitaxial Thin Films", 2012, http://prism.mit.edu/xray, pp. 1-53, MIT Center for Materials Science and Engineering, USA.

Lindberg, Per F. et al. "Electronic Properties of Au/Cu2O/n-type Si Heterojunction for Energy Conversion", Photovoltaic Specialists Conference (PVSC), Nov. 2016, pp. 2807-2810, IEEE, USA.

Li, J. & Clemens, B. "Modeling the Performance of Biaxially-Textured Silicon Solar Cells", Mater. Res. Soc. Symp. Proc. 2014 , pp. 1-9, vol. 1670, Materials Research Society, UK.

Gall S. et al. "Large-Grained Polycrystalline Silicon Thin-Film Solar Cells Using AIC Seed Layers", Photovoltaic Specialists Conference, 2005, pp. 975-978, IEEE, US.

* cited by examiner

METHOD OF MAKING A COPPER OXIDE/SILICON THIN-FILM TANDEM SOLAR CELL USING COPPER-INORGANIC FILM FROM A EUTECTIC ALLOY

This application claims priority to U.S. Provisional Patent Application No. 62/367,178 filed Jul. 27, 2016 entitled "Cuprous Oxide—Silicon Thin-Film Tandem Solar Cell" and is hereby incorporated by reference in its entirety.

The present invention relates to copper oxide thin-film solar cells, transistors, and other electronic devices.

BACKGROUND OF THE INVENTION

For large scale photovoltaic power generation, abundant elements like silicon are necessary so there is no supply concern in the long run. Copper is such an element, as is $O_2$. Together these elements form copper oxide, the very first semiconductor ever to be discovered. Copper oxide may refer to different compounds including: $Cu_2O$, $CuO$, $CuO_2$, $Cu_2O_3$. All oxides of copper are non-toxic and can be deposited as thin-films relatively simply and at low cost. Unfortunately, despite these attractive attributes, the highest reported photovoltaic efficiency for a $Cu_2O$ absorber device is only 5%. This low number means that the current state of the art copper oxide devices are not even close to being competitive on the market. However, since the detailed balance limit of the material has been calculated to exceed 20%, commercialization is a possibility with the right materials engineering. Here, a technology for achieving high efficiency copper oxide solar cells in a cost effective manner is disclosed for the first time.

SUMMARY OF THE INVENTION

High efficiency copper oxide electronic devices are achieved in the following way: Following the solid phase eutectic deposition process disclosed by P. Chaudhari in U.S. Pat. No. 9,054,249 B2 (incorporated by reference in its entirety), a silicon film is deposited onto a highly textured oxide buffer layer on soda-lime glass from a silicon-copper eutectic melt. Oxygen is introduced to the Cu on Si film and a textured $Cu_2O$ film is formed on the textured silicon film thus forming the material for a high efficiency tandem solar cell (Si/$Cu_2O$).

OBJECT OF THE INVENTION

It is an object of the present invention to provide a simple method of fabricating a copper oxide/silicon thin film tandem solar cell.

It is yet another object of the present invention to provide a simple method of fabricating a copper oxide/silicon thin-film tandem solar cell on inexpensive soda-lime glass or polymers for low temperature deposition.

It is yet another object of this invention to provide a simple method of fabricating a copper oxide/silicon thin-film tandem solar cell on metal tapes or quartz for higher temperature deposition.

It is yet another object of this invention to provide a simple method of fabricating a copper oxide ($Cu_2O$) film on the inorganic (silicon) film which can be used as a hole transport layer or contact layer on which another film can be deposited for a tandem solar cell.

BRIEF DESCRIPTION OF THE DRAWINGS

A more detailed understanding of the invention may be had from the following description of some preferred embodiments, given by way of example and to be understood in conjunction with the accompanying drawings, wherein.

DETAILED DESCRIPTION

Figure 1A:
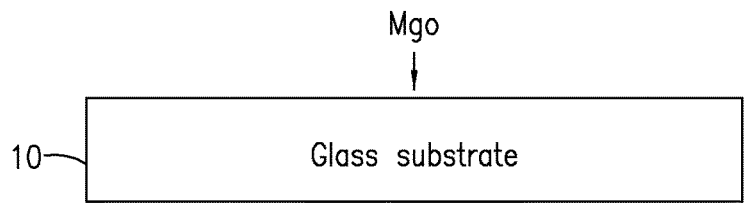
FIGS. 1a-1e are a schematic of the an embodiment of the present invention, oriented copper oxide on oriented silicon on MgO/glass.
Figure 1B:
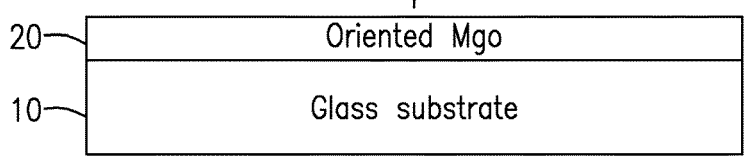
Figure 1C:
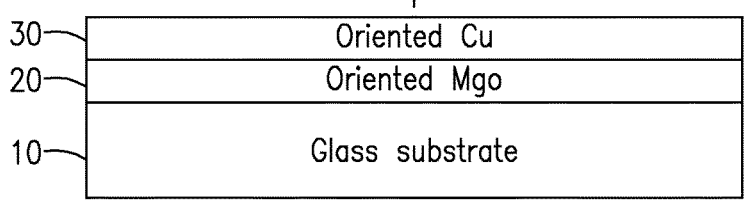
Figure 1D:
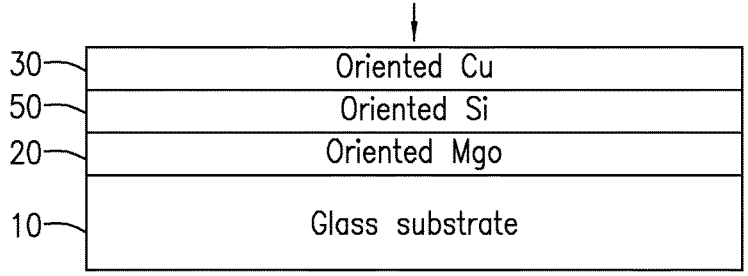
Figure 1E:
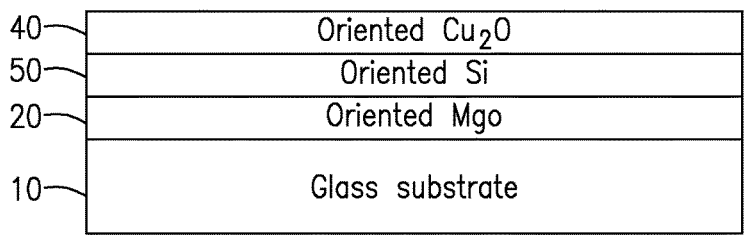
Figure 2A:
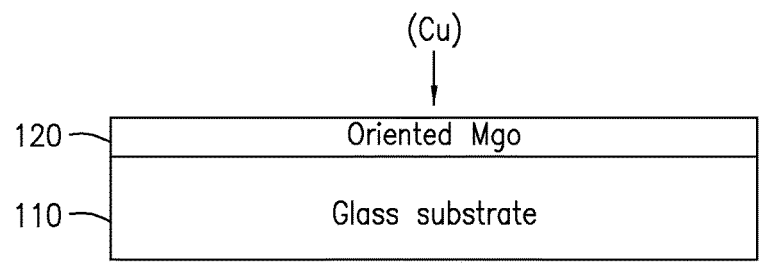
FIGS. 2a-2d are a schematic representation of one embodiment of the present invention to grow highly oriented $Cu_2O$ film.
Figure 2B:
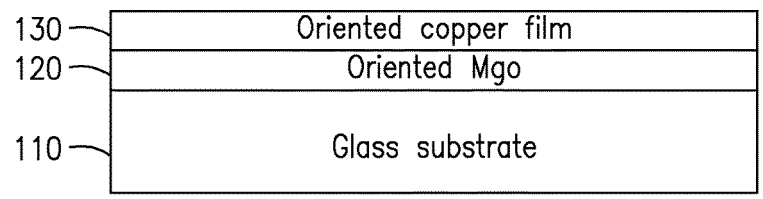
Figure 2C:
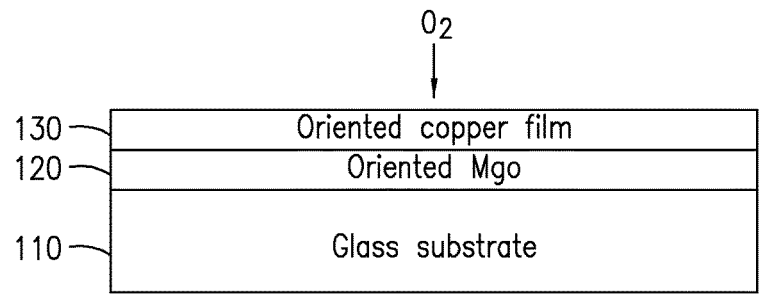
Figure 2D:
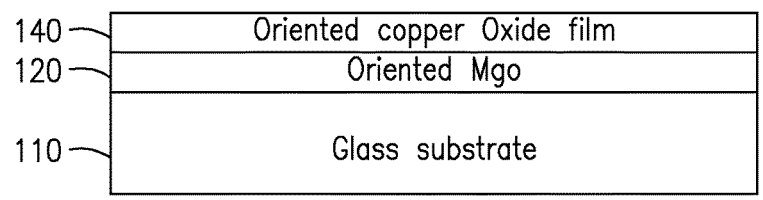
Figure 3A:
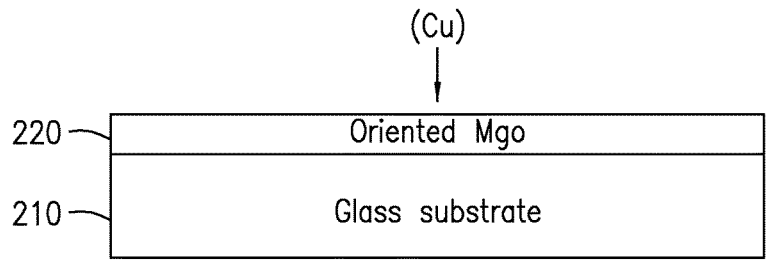
FIGS. 3a-3d are a schematic representation of another embodiment of the present invention forming a copper oxide hole transport layer.
Figure 3B:
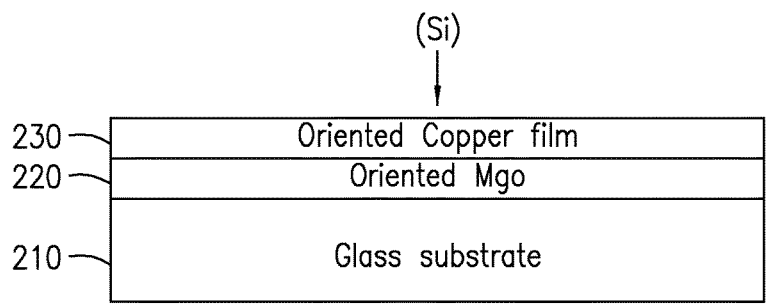
Figure 3C:
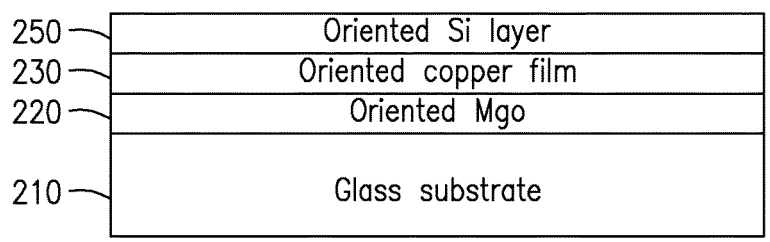
Figure 3D:
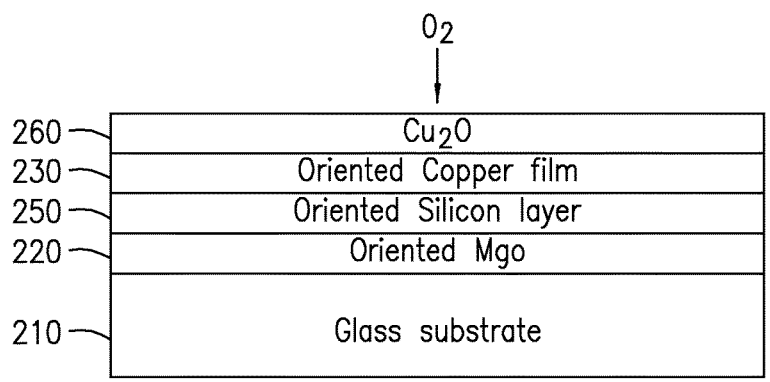

Because the eutectic temperature of copper with silicon is high, 802° C. (1476° F.), liquid phase deposition from the eutectic melt on inexpensive substrates such as soda-lime glass or polymers is not possible without melting these substrates. Instead, deposition can take place in the solid phase of the eutectic melt for deposition at a lower temperature on soda-lime glass (or the liquid phase can be used to deposit on quartz or metal tapes which allow for much higher eutectic temperatures). This solid phase process is illustrated in FIGS. 1a-1e. FIG. 1a shows MgO being deposited on glass substrate 10. FIG. 1b shows copper being deposited on textured/oriented MgO film 20, on glass substrate 10. As shown in FIG. 1c, silicon is deposited on textured/oriented copper film 30. FIG. 1d illustrates that copper film 30 diffuses to the surface of the textured/oriented silicon film 50 driven by its lower surface energy relative to the silicon surface. Oxygen is introduced to the copper film 30 on textured/oriented silicon film 50 and a textured epitaxial $Cu_2O$ film 40 is formed on the textured silicon film 50 thus forming the material for a high efficiency tandem solar cell (Si/$Cu_2O$). This final product is illustrated in FIG. 1e. High efficiency (up to 45%) is possible due to the wide bandgap of $Cu_2O$ (2.2 eV) working in tandem with the lower bandgap of Si (1.1. ev) chosen as the underlying material. Germanium (0.6 ev) can also be chosen as the underlying material. The $Cu_2O$ film is textured, replicating the silicon film, which in turn has been induced to grow with texture by the oxide buffer layer. Such buffer layers can be MgO, $Al_2O_3$, and ZnO, or any oxide buffer layer that can be grown with [111] texture is a candidate. Also, any inorganic material besides Si, such as Ge, that forms a eutectic with copper (Cu), can be used. As stated previously, if metal tapes or quartz are used instead of soda-lime glass, the liquid phase of the silicon-copper eutectic melt can be used if desirable. The materials can be used for a variety of electronic devices, not just tandem solar cells, but also LEDs, thin-film transistors, etc.

The silicon/$Cu_2O$ silicon material is likely to consist of a good ohmic contact or can serve as one if a silicide is formed from the Cu—Si eutectic melt. It is known that copper forms a silicide compound with silicon. $Cu_2O$ has a cubic unit cell structure and an energy bandgap between 1.7 and 2 eV depending on the deposition conditions (Wong et al). Since the bandgap is direct, the absorption coefficient is relatively high. All these factors make it an ideal top layer for a silicon thin-film tandem device. And many other devices can be made from this material, including thin film transistors.

FIGS. 2a-2d illustrate one embodiment of the present invention wherein copper is deposited directly on a highly oriented oxide buffer layer 120 on a substrate 110, forming a highly oriented metal film 130. $O_2$ is then introduced to grow the $Cu_2O$ film 140 (without silicon film growth) which is now also highly oriented.

FIGS. 3a-3d illustrate another embodiment of the present invention wherein the copper oxide film is formed on an inorganic film (silicon) 250 as described above and used as a hole transport layer in a tandem solar cell device. The copper oxide hole transport layer 260 is formed by depositing copper on a highly oriented oxide buffer layer 220, MgO for example, on substrate 210, followed with depositing silicon 250 on the highly oriented copper metal film 230. Substrate 210 is heated to below the eutectic temperature of the Cu—Si system for a solid phase process. During the solid phase eutectic crystallization process copper layer 230 diffuses to the top of silicon layer 250. $O_2$ is then introduced to Cu layer 230 deposited on the inorganic film 220. Alternatively, the copper oxide hole layer 260 is formed on a transparent oxide layer (such as MgO) and the inorganic film deposited on it from a copper silicide-silicon eutectic melt.

Figure 4A:
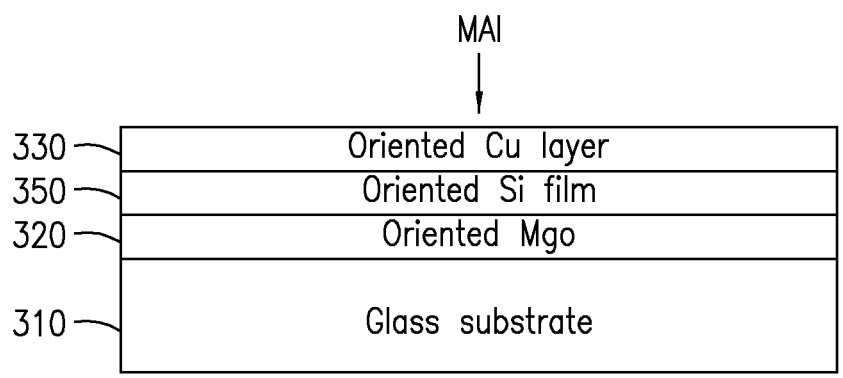
FIGS. 4a and 4b are a schematic representation of yet another embodiment of the present invention in which the copper is used as a metal in a perovskite layer.
Figure 4B:
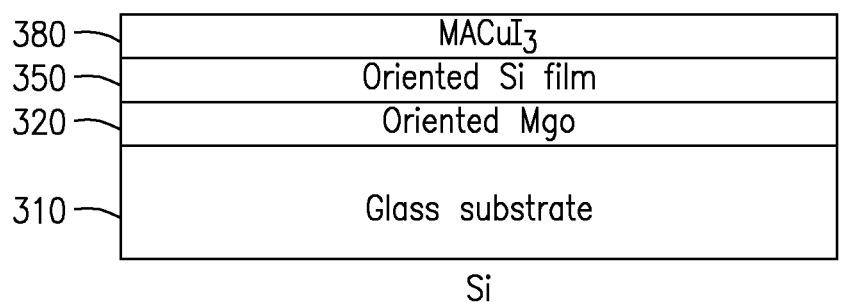

FIGS. 4a and 4b illustrate yet another embodiment of the invention, wherein copper 330 on silicon layer 350 is used as the metal in a perovskite layer 380—for example $MACuI_3$. A highly oriented oxide buffer layer 320 is deposited on substrate 310. After a solid phase eutectic process, copper layer 330 diffuses to the top of silicon layer 350. Copper can be used in perovskite materials for solar cell fabrication (W. Yin et al).

In another embodiment of the present invention, the Cu thin-film that forms on the inorganic layer remains unoxidized yet serves as a simple transparent conductor. Because the film thickness in this embodiment is in the region of 10 nm, it is transparent. The thickness of the metal Cu film can be controlled to optimize both transparency and conductivity. It should be noted that since the metal film is on silicon (not glass or plastic as is normally the case with transparent conducting oxide) it can be even thinner without aggregating into droplets which happens on glass and plastic. The thin Cu layer thus can serve as an effective electrode in a thin-film tandem device.

In yet another embodiment of the present invention, the morphology of the copper oxide layer has a morphology substantially matching the morphology of the inorganic film or other substrate to which the layer is applied. For example, the RMS (root mean squared) roughness of the copper oxide layer in some embodiments of the present invention is less than 10 nm, and preferably less than 5 nm and even preferably less than 3 nm. The grain size in some embodiments is greater than 1 micron and the inorganic film is greater than 30 microns.

Yttrium barium copper oxide (YBCO) is a "cuprate" and in one embodiment of this invention yttrium and barium are introduced to the copper oxide layer by co-evaporation (or sputtering or any other deposition method known in the art) thus forming YBCO either on MgO or on the inorganic film (e.g. Si) on MgO/glass. The cuprate superconductors have a layered crystal structure consisting of $CuO_2$ planes separated by charge reservoir layers, which may dope electrons or holes into the $CuO_2$ planes. On doping holes, the antiferromagnetic Mott insulating phase of the parent compounds disappears and superconductivity emerges.

When considering device fabrication, the more difficult architecture is the monolithically integrated cell, where the cell consists of a number of layers that are mechanically and electrically connected. These cells are difficult to produce because the electrical characteristics of each layer have to be carefully matched. In particular, the photocurrent generated in each layer needs to be matched otherwise electrons will be absorbed between the layers. This limits their construction to certain materials (best met by III-V semiconductors).

Current can be controlled by the absorber thicknesses of the tandem layers. The present invention greatly facilitates this control because the layers are deposited by various methods such as e-beam evaporation and the layers are thin-films, not wafers cut from a boule. Thus very thin films can be deposited, and fine-tuned to reach the exact thickness. Fabrication of a monolithically integrated cell can therefore be achieved with less difficulty using the techniques disclosed in this invention.

In the present invention, the terms "textured", "oriented," and "large grain" have the following meaning: "textured" and "oriented" both mean preferred orientation of crystals (or grains) in the film and that the crystals in the film have preferential orientation either out-of-plane or in-plane or both. For example, in the present invention the films could be oriented out-of-plane, along the c-axis and the silicon film in this invention has a preferred [111] orientation. By "large grain" it is understood to imply a grain size larger than would have been achieved if a silicon (or other inorganic material) had been deposited under the same conditions but without metals, i.e. Cu. Moreover, "large grain" means the grain size is comparable to or larger than the carrier diffusion length such that electron-hole recombination at grain boundaries is negligible. In semiconductor films this means that the grain size is greater than or equal to the film thickness.

Furthermore, in the present invention, the terms "epitaxy", "epitaxial", or other variations of the word (including "heteroepitaxy") can be defined as follows: "a single crystal layer that grows with a particular orientation determined by the single crystal substrate." This definition does not require the film and substrate to be lattice matched, but must still be similar enough to interact and have a defined relationship. "Epitaxy" is also defined as "any film which resembles a single crystal in its lattice structure and properties." Many newer types of heteroepitaxial thin films sometimes include films with different crystal structures than the substrates. The film and substrate structures might belong to different crystal systems: for example, a cubic film growing on a hexagonal substrate. The geometric relationship between the film and substrate is more complex. These films tend to have less lattice strain and higher defect concentration, particularly mosaicity, because the relationship between the film and substrate is weaker. (See Dr. S. Speakman, "Introduction to High Resolution X-Ray Diffraction of Epitaxial Thin Films," MIT Center for Materials Science and Engineering).

Example 1 of the Invention

A good high vacuum system with two electron beam guns is used to deposit copper and silicon independently. A soda-lime glass substrate coated with textured MgO [111] is held at temperatures between 575° C. and 600° C. These are nominal temperatures. It is understood to one skilled in the art that lower or higher temperatures can also be used depending upon the softening temperature of the glass substrate or the reaction kinetics of either copper or silicon with the MgO layers when used as substrates. A thin copper film of approximately 10 nm thickness is deposited first. This is followed by a silicon film deposited at a rate of 2 nm per minute on top of the copper film at a temperature that is below the liquid eutectic phase temperature, namely, 550° C.-600° C. (If a greater $Cu_2O$ film thickness as the top layer is desirable, a greater ratio of copper to Si can be used.) The silicon atoms diffuse through the copper to heterogeneously nucleate on the MgO surface and propagate this crystallinity to the silicon film remaining on the copper. The film can now be cooled to room temperature, where the film is now comprised of two phases: copper and a relatively large grained and highly textured film of silicon on MgO. The copper diffuses to the surface of the silicon film, driven by its lower surface energy relative to the silicon surface. Rather than etching the film in a solution, which removes the Cu from the two phases, Cu and silicon, leaving behind a silicon film, the Cu in the Cu—Si film can now be oxidized by simply introducing $O_2$ to the copper to form a $Cu_2O$ film on the silicon.

For purposes of solar cell design, a bottom electrode is necessary. This electrode can consist of the Cu—Si layer which may act as a silicide with good ohmic contact to the $Cu_2O$ layer. CuSi (or $Cu_5Si$) is copper silicide which is conducting. If a conducting layer is desirable, the CuSi eutectic film can be used. A silicide can be used with silicon to form a eutectic. For example, CuSi forms a eutectic with Si. There are advantages of growing silicon on the silicide, and vice versa. It is also possible that a very thin Cu film will remain between the MgO buffer and the silicon layer, which can then act as an electrode. The material can now be used for a tandem solar cell device or any number of other electronic devices such as thin film transistors.

For the Cu—Si deposition we have used two electron beam guns as an illustrative example. It is understood to one skilled in the art that other methods such as a single gun with multiple hearths, chemical vapor deposition, thermal heating, or sputtering can also be used, for example.

Example 2 of the Invention

Following the procedure previously described in patent application Ser. No. 14/256,619 by Vispute et al. highly oriented MgO [111] film is deposited on soda-lime glass. Copper (Cu) is then deposited directly on the MgO, and by thermal evaporation and the introduction of $O_2$ (or alternatively $N_2$) the Cu is transformed to $Cu_2O$ (or copper nitride $Cu_3N$). A solar cell can be fabricated with $Cu_2O$, a p-type conductor, and by adding ZnO on top as a hole transporter (n-type), in which a heterojunction can be formed. Light enters through the glass, goes through the transparent MgO, and is absorbed by the $Cu_2O$. Crystalline $Cu_2O$ can be grown below the melting temperature of glass (600° C.)—(previously described in De Los Santos Valladares et al, "Crystallization and electrical resistivity of Cu2O and CuO obtained by thermal oxidation of Cu thin films on SiO2/Si substrates" Thin Solid Films 520 (2012) 6368-6374). The resulting $Cu_2O$ film will be highly textured.

When growing copper oxide films directly on MgO or other oxide layers, thermal evaporation can be used (among many other techniques as described by Valladares et al). At temperatures well below 800° C., crystalline copper oxide films can be grown by annealing. The copper oxide films can be grown with [111] orientation, matching the MgO [111] substrate.

Example 3 of the Invention

Rather than a solid phase deposition in example 1, a liquid phase is used instead. A good high vacuum system with two electron beam guns is used to deposit copper and silicon independently. A quartz glass or metal tape coated with textured MgO is held at temperatures above 800° C., the eutectic temperature of Cu—Si. It is understood to one skilled in the art that temperature can be adjusted depending upon the softening temperature of the glass substrate or the reaction kinetics of either copper or silicon with the MgO layers and metal tapes when used as substrates. A thin copper film of approximately 10 nm thickness is deposited first. This is followed by a silicon film deposited at a rate of 2 nm per minute on top of the copper film until a two phase region comprising solid silicon and a liquid Si—Cu mixture is reached. The deposition is stopped and the sample is slowly cooled to room temperature. Copper diffuses through the silicon film, driven by its lower surface energy relative to silicon. The film can now be cooled to room temperature, where the film now comprises of two phases: copper and a relatively large grained and highly textured film of silicon aligned on the textured MgO buffer layer. Rather than etching the film in a solution, which removes the Cu from the two phases, Cu and silicon, leaving behind a silicon film, the Cu in the Cu—Si film can now be oxidized by introducing $O_2$ to the copper to form a $Cu_2O$ film on the silicon.

For purposes of solar cell design, a bottom electrode is necessary. This electrode can consist of the Cu—Si layer which may act as a silicide with good ohmic contact to the $Cu_2O$ layer. CuSi (or $Cu_5Si$) is copper silicide which is conducting. If a conducting layer is desirable, the CuSi eutectic film can be used. A silicide can be used with silicon to form a eutectic. For example, CuSi forms a eutectic with Si. There are advantages of growing silicon on the silicide, and vice versa. It is also possible that a very thin Cu film will remain between the MgO buffer and the silicon layer, which can then act as an electrode. The material can now be used for a tandem solar cell device or any number of other electronic devices such as thin film transistors. A partially oxidized copper film can be used as an electrode (as described by Zhao et al) for the bottom contact layer in a device.

For the Cu—Si deposition we have used two electron beam guns as an illustrative example. It is understood to one skilled in the art that other methods such as a single gun with multiple hearths, chemical vapor deposition, thermal heating, or sputtering can also be used.

While the principles of the invention have been described in connection with specific embodiments, it should be understood clearly that the descriptions, along with the examples, are made by way of example and are not intended to limit the scope of this invention in any manner. For example, a variety of suitable substrates different from the examples given above can be utilized or a different variety of deposition methods and conditions can be employed as would be understood from this invention by one skilled in the art upon reading this document.

What is claimed is:

1. A method of making a copper oxide/inorganic thin film tandem semiconductor device comprising the steps of:
    depositing a [111] textured oxide buffer layer on an amorphous substrate;
    depositing a copper-inorganic film from a solid phase eutectic alloy on said [111] textured oxide buffer layer, said copper-inorganic film comprising a copper layer and an inorganic film layer, segregating said copper layer from said inorganic film layer and diffusing said copper layer to a surface of said inorganic film layer; and
    introducing $O_2$ to said copper layer on said surface of said inorganic film layer, forming a copper oxide thin film on said inorganic film layer.

2. The method of claim 1, wherein said inorganic film is silicon.

3. The method of claim 2, wherein said silicon film is textured.

4. The method of claim 1, wherein said inorganic film is germanium.

5. The method of claim 1, wherein said copper oxide is $Cu_2O$.

6. The method of claim 5, wherein said copper oxide film is textured.

7. The method of claim 1, wherein said semiconductor device is a solar cell.

8. The method of claim 1, wherein said amorphous substrate is soda-lime glass.

9. The method of claim 1, wherein said amorphous substrate is a metal tape.

10. The method of claim 1, further comprising adding yttrium and barium to said copper oxide film thus forming YBCO.

11. The method of claim 1, wherein said copper oxide film is large grained.

12. The method of claim 1, wherein said inorganic film is less than 30 microns.

13. The method of claim 1, wherein said copper oxide film is less than 1 micron.

14. The method of claim 1, wherein the grain size of the copper oxide film is greater than 1 micron.

15. A method of making a copper oxide/inorganic thin film tandem semiconductor device comprising the steps of:
    depositing a [111] textured oxide buffer layer on an amorphous substrate; and
    depositing a copper-inorganic film from a solid phase eutectic alloy on said [111] textured oxide buffer layer, said copper-inorganic film comprising a copper layer and an inorganic film layer, segregating said copper layer from said inorganic film layer and diffusing said copper layer to a surface of said inorganic film layer, wherein said copper remains, forming a copper thin film.

16. A method of making a copper oxide thin film tandem semiconductor device comprising the steps of:
    depositing a [111] textured oxide buffer layer on an amorphous substrate;
    depositing a thin copper film directly on said [111] textured oxide buffer layer; and
    introducing $O_2$ to said thin copper film, forming a copper oxide thin film on said [111] textured oxide buffer layer.

17. The method of claim 16, wherein said [111] textured oxide buffer layer is MgO.

18. The method of claim 16, wherein said amorphous substrate is soda-lime glass.

19. The method of claim 16, wherein said copper film forms a copper perovskite layer.

20. A method of making a copper oxide thin film tandem semiconductor device comprising the steps of:
    depositing a [111] textured oxide buffer layer on an amorphous substrate;
    depositing a thin copper film on said [111] textured oxide buffer layer; and
    introducing nitrogen to said copper film, forming a copper nitride thin film on said [111] textured oxide buffer layer.

21. A method of making a copper oxide thin film tandem semiconductor device comprising the steps of:
    depositing a [111] textured oxide buffer layer on a metal or quartz substrate;
    depositing a copper-inorganic film from a liquid phase eutectic alloy on said [111] textured oxide buffer layer, said copper-inorganic film comprising a copper layer and an inorganic film layer, segregating said copper layer from said inorganic film layer and diffusing said copper layer to a surface of said inorganic film layer; and
    introducing $O_2$ to said copper layer on said inorganic film layer, forming a copper oxide thin film on said inorganic film layer.

* * * * *